United States Patent [19]
Konno et al.

[11] Patent Number: 5,397,432
[45] Date of Patent: Mar. 14, 1995

[54] METHOD FOR PRODUCING SEMICONDUCTOR INTEGRATED CIRCUITS AND APPARATUS USED IN SUCH METHOD

[75] Inventors: Jun-ichi Konno, Kuwana; Keisuke Shinagawa, Kawasaki; Toshiyuki Ishida, Kawasaki; Takahiro Ito, Kawasaki; Tetsuo Kondo, Kawasaki; Fukashi Harada, Kuwana; Shuzo Fujimura, Tokyo, all of Japan

[73] Assignee: Fujitsu Limited, Kawasaki, Japan

[21] Appl. No.: 743,383

[22] PCT Filed: Jun. 26, 1991

[86] PCT No.: PCT/JP91/00861
  § 371 Date: Aug. 21, 1991
  § 102(e) Date: Aug. 21, 1991

[87] PCT Pub. No.: WO92/00601
  PCT Pub. Date: Jan. 9, 1992

[30] Foreign Application Priority Data
  Jun. 27, 1990 [JP] Japan ................... 2-171791

[51] Int. Cl.$^6$ ............................ H01L 21/00
[52] U.S. Cl. .................... 156/665; 156/643; 156/646; 134/1
[58] Field of Search ........... 156/643, 646, 664, 665, 156/666; 134/1

[56] References Cited

U.S. PATENT DOCUMENTS

| | | | |
|---|---|---|---|
| 4,325,984 | 4/1982 | Galfo et al. | 156/665 |
| 4,985,113 | 1/1991 | Fujimoto et al. | 156/643 |
| 5,200,017 | 4/1993 | Kawasaki et al. | 156/345 |

FOREIGN PATENT DOCUMENTS

| | | |
|---|---|---|
| 0345757 | 12/1989 | European Pat. Off. . |
| 0416774 | 3/1991 | European Pat. Off. . |
| 61-147530 | 7/1986 | Japan . |
| 1-30225 | 2/1989 | Japan . |
| 1-48421 | 2/1989 | Japan . |
| 1-239933 | 9/1989 | Japan . |
| 2-49425 | 2/1990 | Japan . |
| 2-71519 | 3/1990 | Japan . |
| 2-144525 | 6/1990 | Japan . |
| 2-165656 | 6/1990 | Japan . |

OTHER PUBLICATIONS

Solid State Technology, vol. 33, No. 2 (Feb. 1990).
Extended Abstracts, vol. 81-2 (1981), pp. 715-716.
Japanese Patent Abstract of JP-A-1 251 742 (Jan. 1989).

Primary Examiner—R. Bruce Breneman
Assistant Examiner—George Goudreau
Attorney, Agent, or Firm—Nikaido, Marmelstein, Murray & Oram

[57] ABSTRACT

To prevent after-corrosion of wiring or electrodes formed by patterning films of aluminum or an alloy thereof by reactive ion etching (RIE) using an etchant containing chlorine gas or its gaseous compounds, residual chlorine on the surface of the wiring or electrodes is removed by exposing it to a plasma generated in an atmosphere containing water vapor or to neutral active species extracted from the plasma. This treatment is performed either at the same time or after an ashing operation, an operation for removing a resist mask used in the aforesaid RIE by adding water vapor to an atmosphere containing oxygen. To perform the latter separate treatment, an automatic processing system is disclosed in which an after-treatment apparatus for removing residual chlorine is connected, via a second load lock chamber, to an ashing apparatus connected to a RIE apparatus by a load lock chamber which is capable of making a vacuum.

19 Claims, 6 Drawing Sheets

METHOD FOR PRODUCING SEMICONDUCTOR INTEGRATED CIRCUITS AND APPARATUS USED IN SUCH METHOD

BACKGROUND OF THE INVENTION

1. Field of the Invention

The present invention relates to a lithography process for use during the production of semiconductor integrated circuits. More particularly, it relates to the removal of chlorine or bromine which remains on a surface of a conductive film when the conductive film made of aluminum or an alloy thereof is dry-etched by using chlorine or bromine, or an alloy thereof as an etchant.

2. Description of the Related Art

For a wiring forming a semiconductor integrated circuit formed on a substrate, such as silicon wafer or the like, thin films of aluminum (Al) or thin films of an alloy in which silicon (Si) or copper (Co) is added into aluminum are often used. To prevent an increase in the contact resistance of an aluminum or aluminum alloy thin film wiring due to an alloy reaction with a silicon wafer, a so-called barrier metal of a thin film of titanium (Ti), titanium nitride (TiN), or titanium-tungsten (TiW) is provided between the silicon wafer and the aluminum thin film.

Patterning of an aluminum or aluminum alloy film for such wiring as described above is performed generally by a lithography in which the conductive film is selectively etched by using a mask formed of a resist layer. Anisotropic etching is required to make it possible to form fine wiring patterns. At the present time, reactive ion etching (RIE) is a typical anisotropic etching method. For removing a resist mask, a so-called ashing, which can be performed Without using a solvent, such as trichloro ethylene which poses a problem relating to the environmental pollution, is used.

The above-mentioned etching and ashing methods are both a dry process. So, they are suitable for process control or automatic processing and free from the contamination due to impurities in an etching solution or a solvent as in a wet process. An outline of these processes will now be explained with reference to FIGS. 1 and 2.

FIGS. 1(a), 1(b), and 1(c) show a change in the cross section of a member to be processed in the above-described dry etching and ashing processes. FIG. 2 schematically shows an example of the construction of a processing system for automatically performing the etching and ashing operations.

In the system in FIG. 2, a RIE apparatus 10 for etching aluminum films and an ashing apparatus 20 for removing resist masks after etching are connected to each other via a load lock chamber 13 which is capable of a vacuum. Aluminum films are transported by the load lock chamber 13 from the RIE apparatus 10 to the ashing apparatus 20 without contacting the atmosphere. Another load lock chamber 13A is disposed on the entry side of the RIE apparatus 10, and another load lock chamber 13B is disposed on the exit side of the ashing apparatus 20. Substrates on which aluminum films are formed can be inserted into or taken out of the RIE apparatus 10 and the ashing apparatus 20 without introducing air into the apparatuses 10 and 20 by the load lock chambers 13A and 13B.

Referring to FIG. 1(a), for example, an aluminum film 2 is deposited on the whole of a surface of a substrate 1 composed of a silicon wafer, following which a resist is applied onto the aluminum film 2. By applying ultra-violet rays, electron beams, or an energy beam, such as excimer laser, or the like, to a predetermined position of this resist and then developing, a mask 3 composed of the aforesaid resist is formed. The surface of the substrate 1 on which the aluminum film 2 is formed is generally covered with an unillustrated insulation layer composed of $SiO_2$, etc. The surface of the substrate 1 or a lower layer wiring is exposed inside a contact hole provided on a part of the insulation layer.

The substrate 1 with the mask 3 formed thereon as described above is placed on a stage 11 inside the RIE apparatus 10 through the load lock chamber 13A in FIG. 2. Then, for example, chlorine gas ($Cl_2$) is introduced into the RIE apparatus 10 and, while the inside of such apparatus is being maintained at a predetermined pressure, a plasma is generated by applying a voltage between the stage 11 and an electrode 12. As a result, the aluminum film 2 is anisotropically etched, as shown in FIG. 1(b).

The substrate 1 having the aluminum film 2 etched as described above is transported to the ashing apparatus 20 through the load lock chamber 13 in FIG. 2. Then, for example, an oxygen gas ($O_2$) is introduced into the ashing apparatus 20, and while the inside of such apparatus is being maintained at a predetermined pressure, a voltage is applied between a pair of electrodes 16 which are opposed to each other. As a result, a plasma is generated between the electrodes 16. The mask 3 composed of the aforesaid resist reacts mainly with oxygen atoms or molecules, or ions in this plasma and vaporizes, being exhausted outside the ashing apparatus 20. In this manner, the mask 3 on the aluminum film 2 is removed, as shown in FIG. 1(c).

Shown in FIG. 2 is the ashing apparatus 20 which performs plasma ashing in which a member to be processed is directly exposed to the plasma. The above-described processes are performed in the same manner as for an automatic processing system equipped with a so-called down-flow type ashing apparatus which exposes the member to be processed to only neutral active species extracted from a plasma. As a means for generating the aforesaid plasma, excitation by microwave radiation or excitation using a high-frequency induction coil is often used in place of the electrode 16.

In a RIE for films of aluminum or an alloy thereof, gaseous chlorine compounds, such as boron trichloride ($BCl_3$) or silicon tetrachloride ($SiCl_4$), bromine gas ($Br_2$), or gaseous bromine compounds, such as hydrogen bromide (HBr) or boron tribromine ($BBr_3$), are also used as an etchant.

If the substrate 1 upon which etching and ashing has been performed as described above is taken out into the atmosphere, a phenomenon is often recognized in that "after-corrosion" occurs in wiring composed of thin films of aluminum or an alloy of aluminum. The resistance of the wiring increases due to this after-corrosion, and in extreme cases disconnection occurs. Such after-corrosion proceeds while a semiconductor integrated circuit in a state in which the wiring is covered with a passivation insulation layer is used for a long period of time, thereby resulting in the poor reliability of products.

The mechanism causing such after-corrosion as described above is not yet completely clarified. It is considered that after-corrosion is due to the fact that chlorine, bromine, or their compounds, which are components of the etchant used in etching can, remain on the surface of an aluminum film. That is, the residual chlorine, for example, reacts with the water of the atmosphere, generating hydrochloric acid (HCl), etc., which causes aluminum films to become corroded.

The introduction of the automatic processing system shown in FIG. 2 enables an aluminum film to be sent to an ashing apparatus without being exposed to the atmosphere. And, since most of the remaining chlorine or the like are removed by the ashing apparatus. Accordingly, after-corrosion described above is considerably reduced.

In recent years, however, aluminum-copper (Al-Cu) alloys, in which electro-migration and stress migration do not often occur in comparison with pure aluminum films, have come to be used as a wiring material. As mentioned earlier, thin films of Ti, TiN, or TiW are used as barrier metals for blocking the alloy reaction between a silicon substrate or polycrystal silicon lower-layer wiring, and aluminum wiring.

The use of Al-Cu alloy films or barrier metals promotes after-corrosion because an electric cell is formed on the grain boundaries of different types of metals or the interface of the barrier metal and aluminum films because of the presence of hydrochloric acid generated from the above-mentioned residual chlorine. Therefore, even if the automatic processing system shown in FIG. 2 is introduced, a problem is posed in that after-corrosion cannot be completely avoided.

SUMMARY OF THE INVENTION

Accordingly, it is an object of the present invention to provide an apparatus for preventing after-corrosion in wiring composed of the aforesaid thin films of aluminum or an alloy thereof, more particularly, to provide a method which is capable of more completely removing chlorine or the like which remains after the aforesaid ashing on all the exposed surfaces including the side of the wiring and on the surface of a substrate exposed in the periphery of the wiring, and to provide an apparatus for performing such a method.

As a result, the present invention improves the production yield of semiconductor integrated circuits having wiring composed of thin films of aluminum or an alloy thereof, and enhances the reliability of the semiconductor integrated circuits for use for a long period of time.

The present invention is characterized by including any one of the following modes. That is, (1) As shown in FIG. 3(a), a film 2 of aluminum or an alloy thereof formed on a surface of a substrate 1 is covered with a mask 3 composed of a resist. The aluminum film 2 is exposed through the mask 3 and selectively etched by using chlorine, bromine, or a gaseous etchant containing a compound thereof. The mask 3, used in the aforesaid etching, is ashed and removed, when it is directly exposed to a plasma generated in an atmosphere containing oxygen and water vapor, or exposed to neutral active species extracted from the plasma. Residual chlorine, bromine, or a compound thereof on the surface of the film 2 which is exposed as a result of the removal of the mask 3 is dissociated from the surface by forming volatile compounds, such as HCl, and removed. Or, (2) While the mask 3 is ashed by neutral active species extracted from a plasma generated in the atmosphere containing oxygen gas, the film 2, which is revealed along the removal of the mask 3 is exposed to a plasma generated in an atmosphere containing water vapor, in order that residual chlorine or the like is removed as described in above (1). Or, (3) As shown in FIG. 3(b), after removing the mask 3 by an ashing process, the thin film 2 is exposed directly to a plasma generated in an atmosphere containing water vapor or to neutral active species extracted from the plasma in order that residual chlorine or the like on the surface thereof is removed as described in above (1).

In FIGS. 3(a) and 3(b), $O_2$ and $H_2O$ are shown as representative of the aforesaid neutral active species, $CO_2$ as representatives of the reaction products when the resist mask 3 is removed, and HCl as representative of the product when the aforesaid neutral active species and the residual chlorine react and are removed. Of course, the aforesaid neutral active species and the products are not limited to these examples.

(4) An automatic processing system is constructed in order that the removal of residual chlorine or the like in the mode (3) above, can be performed by using an apparatus different from an ashing apparatus. That is, as shown in FIG. 4, a after-treatment apparatus 40 is connected, via a load lock chamber 13C, to the ashing apparatus 20, which is connected to the RIE apparatus 10 via the load lock chamber 13. For the after-treatment apparatus 40, either a down flow type or a plasma processing type where a member to be processed is directly exposed to the plasma, is used in the same manner as in the ashing apparatus 20.

In FIG. 4, reference numeral 1 denotes a substrate having a thin film of aluminum or an alloy thereof selectively covered with a resist mask but not etched. Reference numeral 1' denotes a substrate on which the aforesaid thin film is etched. Reference numeral 1" denotes a substrate from which the aforesaid resist mask has been removed.

The applicant of the present invention has proposed an ashing method whereby water is added into the aforesaid gas for the purpose of increasing the ashing speed in down-stream ashing in which gases having oxygen are used (Japanese Patent Laid-Open No. 64-48421, Application date: Aug. 19, 1987). In this method, however, conditions for etching (a process anterior to an ashing operation) are not specified. Moreover, in this application, there is not even a suggestion that the addition of water to the ashing atmosphere prevents after-corrosion of aluminum films which are patterned by using an etchant, such as chlorine gas or the like.

The applicant of the present invention has also proposed a method of preventing after-corrosion by exposing aluminum films which are etched by using a chlorine-type reactive gas, to water vapor in a pressure-reduced atmosphere (Japanese Patent Laid-Open No. 3-41728, Application date: Jul. 7, 1989). In this method, however, the removal of residual components, such as chlorine or the like, which cause after-corrosion, depends on a thermal reaction, and a substrate to be processed is heated to approximately 120° C. in order to promote this reaction.

In the present invention in contrast with these applications, aluminum films patterned by using an etchant, such as chlorine gas or the like are exposed directly to a plasma generated in an atmosphere containing water vapor or to active species extracted from this plasma, such as $H_2O$ in an excited state or hydrogen (H) in an atomic state, or OH free radicals, or the like, in order for residual chlorine or the like to be removed. As a consequence, since a removal reaction is more actively promoted than in a method which exposes aluminum films simply to water vapor as in the above-described application, it is possible to remove chlorine or the like which is strongly attached and cannot be removed by a thermal reaction.

These and other objects, features and advantages of the present invention will become clear when reference is made to the following description of the preferred embodiments of the present invention, together with reference to the accompanying drawings.

DESCRIPTION OF THE PREFERRED EMBODIMENTS

Figure 1A:
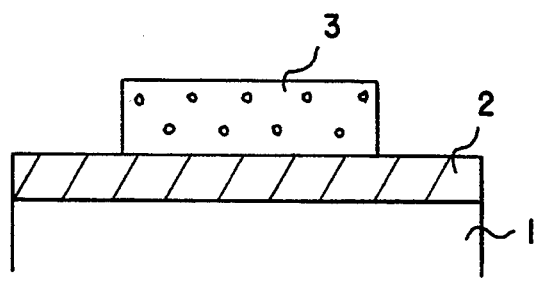
FIG. 1 is a schematic cross-sectional view showing a process for patterning wiring of a semiconductor integrated circuit.
Figure 1B:
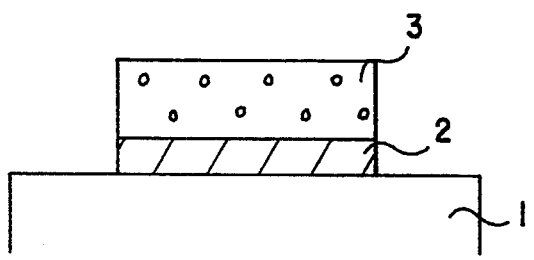
Figure 1C:
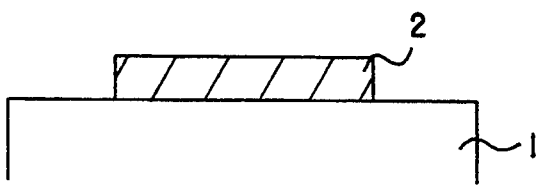

Various embodiments of the present invention will be explained below with reference to the accompanying drawings. Throughout the figures, the same parts as those in figures shown previously are given the same reference numerals.

(First Embodiment)

Figure 2:
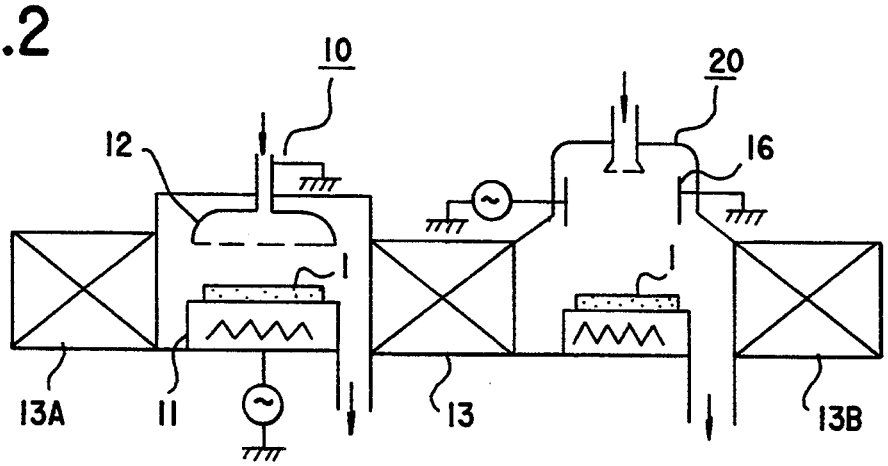
FIG. 2 is a schematic view showing an example of the construction of an automatic processing apparatus for performing wiring patterning in a semiconductor integrate circuit.
Figure 3A:
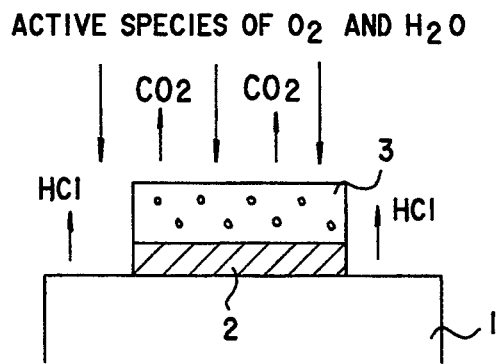
FIG. 3 is a schematic cross-sectional view showing a principle of the present invention.
Figure 3B:
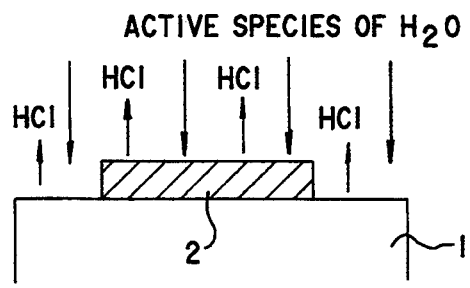

A substrate 1 on which is formed a mask 3 composed of a resist, with which a film 2 composed of aluminum containing 2% copper (Al-2%Cu) is selectively covered, as shown in FIG. 1(a), is transported into a RIE apparatus 10 through a load lock chamber 13A in the automatic processing system shown in FIG. 2 and placed on a stage 11.

After the inside of the RIE apparatus 10 is turned to a vacuum of, for example, $2 \times 10^{-4}$ Torr, a gaseous mixture of chlorine gas ($Cl_2$) and silicon tetrachloride ($SiCl_4$) is introduced thereto. The total pressure is maintained at $8 \times 10^{-2}$ Torr, and a high-frequency voltage is applied between the stage 11 and the electrode 12. As a result, the aluminum film 2 (not shown) on the substrate 1 is anisotropically etched by ions and radicals in the plasma generated between the stage 11 and the electrode 12.

The substrate 1 with the aluminum film 2 etched as described above is transported to the ashing apparatus 20 through the load lock chamber 13 which has been turned into a vacuum and placed on a stage 14. The ashing apparatus 20 in the figure is of a so-called plasma ashing type. Oxygen gas ($O_2$) and water vapor ($H_2O$) are introduced into the ashing apparatus 20 each at a flow rate of 1 to 2 SLM, and 100 to 300 SCCM, and the total pressure is maintained at 1 Torr. Then, the substrate 1 is heated, for example, to 100° to 200° C., by a heater disposed on the stage 14. In this state, plasma is generated by supplying, for example, high frequency power of approximately 1.5 kW at a frequency of 2.54 GHz; and the aforesaid resist mask 3 is ashed. Even when the aluminum film 2 processed as in the above-described embodiment was left in the air for 48 hours, an occurrence of after-corrosion could not be detected. In comparison, an ashing operation was performed without adding water vapor to gas introduced to an ashing chamber 21B in the above-described embodiment, then it was detected that after-corrosion occurred when the aluminum film 2 was left in the air for one hour.

Also, the same results as described above were obtained in cases where chlorine ($Cl_2$) gas introduced into the RIE apparatus 10 in the above description was substituted by bromine ($Br_2$) gas, and silicon tetrachloride ($SiCl_4$) was substituted by silicon tetrabromide ($SiBr_4$).

(Second Embodiment)

Figure 6:
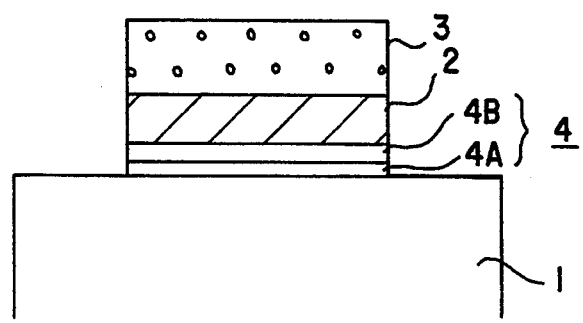
FIG. 6 is a schematic sectional view showing an example of wiring construction processed by a method of the present invention.

Etching and ashing operations were performed on the aluminum film 2 and the resist mask 3 in the same manner as in the above-described embodiment. The aluminum film 2, composed of Al-2%Cu, is formed on the substrate 1 via a barrier metal 4 (made of a titanium (Ti) film 4A and a titanium nitride (TiN) film) as shown in FIG. 6. In that operation, no occurrence of after-corrosion could be detected even when the aluminum film 2 from which the mask 3 was removed was left in the air for 48 hours.

(Third Embodiment)

Figure 5A:
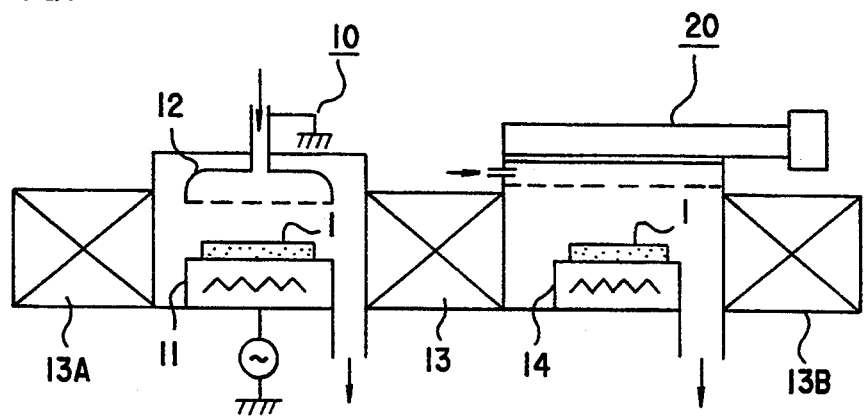
FIG. 5(a) is a schematic view showing an example of the construction of an automatic processing apparatus used for effecting the present invention.
Figure 5B:
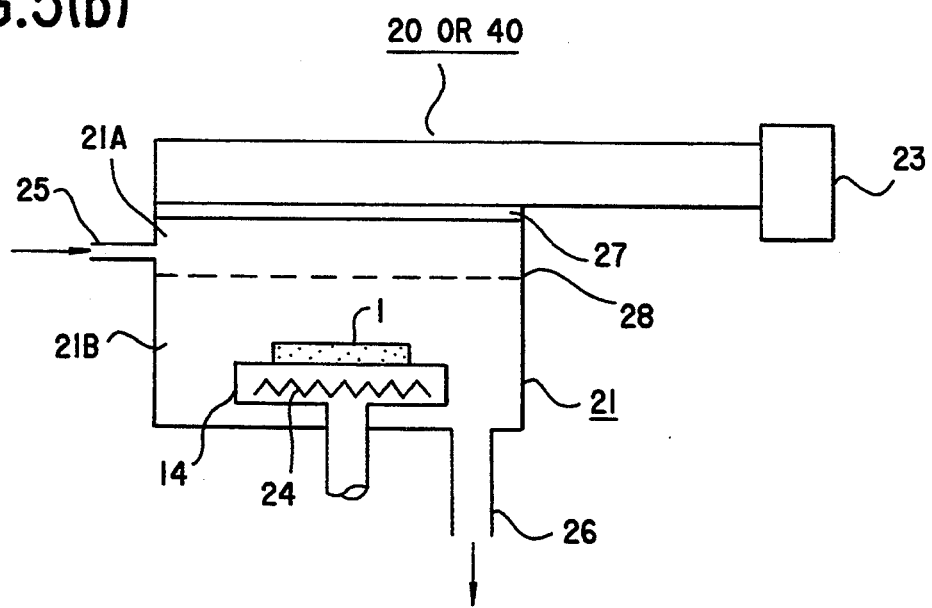
FIG. 5(b) is a schematic view showing a detailed construction of an ashing apparatus 20 or an after-treatment apparatus 40 in FIG. 4 or FIG. 5(a)

An aluminum film was etched and ashed by using an automatic processing system shown in FIG. 5(a). The RIE apparatus 10 in the figure is of a parallel flat-plate electrode type having the stage 11 on which a substrate to be processed is placed and an electrode 12 opposing the stage 11. The ashing apparatus 20 is of a so-called down flow type and has a detailed construction, for example, as shown in FIG. 5(b). In this example, a cylindrical chamber 21 made of aluminum is divided into a plasma generation chamber 21A and an ashing chamber 21B by a shower head 28 in which a large number of small openings having a diameter of approximately 2 to 3 mm are disposed. A microwave generation source 23 like a magnetron is connected to one end of the plasma generation chamber 21A via a microwave transmission window 27.

Referring to FIGS. 5(a) and 5(b), the substrate 1 made of a silicon wafer having a diameter of 4 inches in which a film made of Al-2%Cu is formed is transported into the RIE apparatus 10 through the load lock chamber 13A, placed on the stage 11, and heated to a predetermined temperature. A gaseous mixture of $BCl_3$, $SiCl_4$, and $Cl_2$ was introduced, as an etchant, into the RIE apparatus 10, and the total pressure was maintained at 0.08 Torr. For this reason, the flow rate of $BCl_3$, $SiCl_4$, and $Cl_2$ was respectively controlled at 80 SCCM, 400 SCCM, and 10 SCCM. In this state, a plasma is generated by supplying high-frequency power between the stage 11 and the electrode 12. The power supplied at this time is 350W. The aforesaid aluminum film is anisotropically etched for approximately 180 seconds under these conditions.

Next, the substrate 1 is transported, via the load lock chamber 13, into the ashing apparatus 20, placed on the stage 14, and heated to 180° C. by a heater 24 disposed on the stage 14. Oxygen ($O_2$) and water vapor ($H_2O$) are mixed at the rate of the flow rate of 1350 SCCM and 150 SCCM, respectively, and introduced into the plasma generation chamber 21A via a gas introduction pipe 25. The total pressure is maintained at 1.0 Torr. In this state, the microwave generation source 23 is activated to generate a plasma. The output of the microwave generation source 23 at this time is 1.0 kW, and the operating time is 120 seconds. The resist mask is ashed and residual chlorine (Cl) on the aluminum film are removed by neutral active species in the plasma generated in this manner.

That is, a shower head 28 is composed of, for example, pure aluminum. Therefore, no plasma will occur inside the ashing chamber 21B, whereas only the neutral active species inside the plasma generation chamber 21A flow out into the ashing chamber 21B through small openings of the shower head 28. These neutral active species include atomic oxygen (O), hydrogen (H), excited molecules of $O_2$, $H_2O$, etc., and active species, such as OH free radicals. It is considered that each of these is involved with the ashing of a resist mask, but it is considered that the ashing is contributed mainly by atomic oxygen (O) and excited oxygen molecules ($O_2$).

On the other hand, the residual chlorine on the surface of the aluminum film etched as described above reacts mainly with atomic hydrogen (H) and OH free radicals in the aforesaid neutral active species to produce a volatile compound, for instance, hydrogen chloride (HCl). The residual chlorine is released from the substrate 1, and discharged to the outside through an exhaust pipe 26. Residual chlorine present on the $SiO_2$ surface exposed in the periphery of the aluminum film 2 similarly produces HCl and is discharged.

According to a downflow type apparatus, the degradation of characteristics of elements forming an integrated circuit is small because the substrate 1 to be processed is not subjected to ion bombardment, as in a plasma ashing type apparatus shown in FIG. 2. Also, chances that impure ions of sodium (Na), heavy metals, etc. are injected are reduced.

An occurrence of after-corrosion was not detected even when an aluminum film processed as in the above-described embodiment was left in the air for 48 hours.

(Fourth Embodiment)

Figure 4:
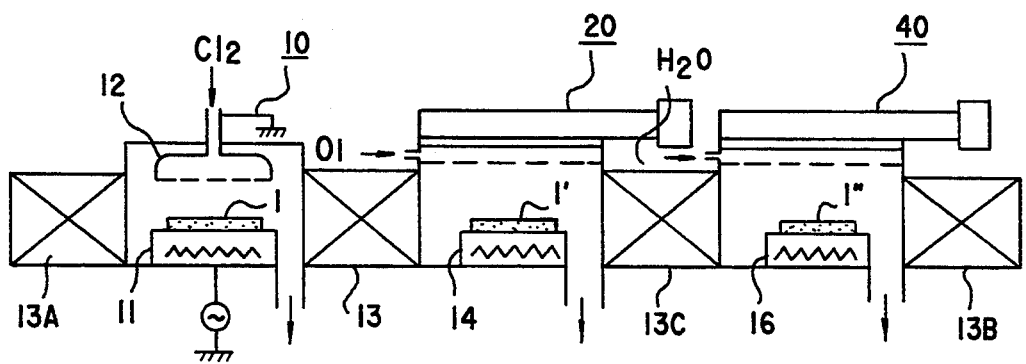
FIG. 4 is a schematic view showing an example of the construction of an automatic processing apparatus of the present invention.

An operation for etching an aluminum film composed of Al-2%Cu an operation for ashing a resist mask, and an after-treatment for removing residual chlorine were performed by using the automatic processing system shown in FIG. 4 in which the after-treatment apparatus 40 for removing residual chlorine or bromine on the surface of an aluminum film is disposed independently of the ashing apparatus 20 for removing a resist mask. Since the after-treatment apparatus 40 is of a down-flow type apparatus shown in FIG. 5(b) similarly to the ashing apparatus 20, the same reference numerals are used to explain the details thereof.

The substrate 1, on which are formed the aluminum film 2 composed of Al-2%Cu shown in FIG. 1(a) and the mask 3 formed of a resist with which the aluminum film 2 is covered, is etched by the RIE apparatus 10 in the automatic processing system shown in FIG. 4. The etching conditions are the same as those for the above-described embodiments.

Next, the substrate 1 is transported into the ashing apparatus 20 through the load lock chamber 13, placed on the stage 14, and heated to 180° C. by the heater 24 disposed on the stage 14. Oxygen ($O_2$) is introduced into the plasma generation chamber 21A via the gas introduction pipe 25 at a flow rate of 1350 SCCM, and the total pressure is maintained at 1.0 Torr. In this state, the microwave generation source 23 is activated to generate a plasma. The output of the microwave generation source 23 at this time is 1.0 kW, and the operating time is 120 seconds. The resist mask is ashed by neutral active species in the plasma generated in this manner.

Next, the substrate 1 is transported, via the load lock chamber 13C, into the after-treatment chamber 40, placed on the stage 16, and heated to 180° C. by a heater disposed on the stage 16. Water vapor ($H_2O$) is introduced into the plasma generation chamber 21A via the gas introduction pipe 25 at a flow rate of 150 SCCM, and the total pressure is maintained at 1.0 Torr. In this state, the microwave generation source 23 is activated to generate a plasma. The output of the microwave generation source 23 at this time is 1.0 kW. The residual chlorine (Cl) on the aluminum film is exhausted, as HCl, to the outside of the after-treatment apparatus 40 by neutral active species in the plasma generated in this manner.

No occurrence of after-corrosion was detected even when each of the three kinds of aluminum films on the substrate 1 was left in the air for 48 hours, upon which aluminum films after-treatment was performed for different times (30, 90, and 180 seconds) under the above-described conditions.

(Fifth Embodiment)

In comparison, samples of ①  to 13 shown in Table 1 were produced. The amount of residual chlorine were measured, and the occurrence of after-corrosion when these samples were left in the air for 48 hours was observed. These samples are formed of Al-2%Cu thin films formed on a silicon wafer having a diameter of 4 inches. Conditions for treating each sample in Table 1 are as follows. That is, ①: A state in which a resist mask is left on the aluminum film, with reactive ion etching being performed in the same manner as in the above-described embodiments 1 through 4.

②: Downflow ashing by using a plasma generated in oxygen ($O_2$) is performed upon a resist mask on an aluminum film on which reactive ion etching is performed in the same manner as in the above-described embodiments 1 through 4 (Flow rate of $O_2$: 1500 SCCM, pressure: 1 Torr, microwaves power: 1.0 kW, substrate temperature: 180° C., and ashing time: 180 seconds).

③: Downflow ashing is performed upon a resist mask on an aluminum film on which reactive ion etching is performed in the same manner as in the above-described embodiments 1 through 4 by a plasma generated in mixed gas of oxygen ($O_2$) and carbon tetrafluoride ($CF_4$) (Flow rate of $O_2$: 1500 SCCM, flow rate of $CF_4$: 150 SCCM pressure: 1 Torr, microwaves power:

1.0 kW, substrate temperature: 180° C., and ashing time: 120 seconds).

④: Corresponds to the above-described third embodiment.

⑤ ⑦: After downflow ashing is performed upon samples by a plasma generated in the oxygen ($O_2$) in the same manner as in the above ②, the samples were exposed to water vapor ($H_2O$) (Flow rate of $H_2O$: 1500 SCCM, pressure: 1 Torr, substrate temperature: 180° C., and ashing times: 30, 90, and 180 seconds).

⑧ to 10 : Corresponds to the above-described fourth embodiment.

11 to 13 : After downflow ashing is performed upon samples by a plasma generated in the oxygen ($O_2$) in the same manner as for the sample of ② above, they were after-treated by the down flow of plasma generated in hydrogen ($H_2$) (Flow rate of $H_2$: 1500 SCCM, pressure: 1 Torr, microwaves power: 1.5 kW, substrate temperature: 180° C., and ashing times: 30, 90, and 180 seconds).

Figure 9:
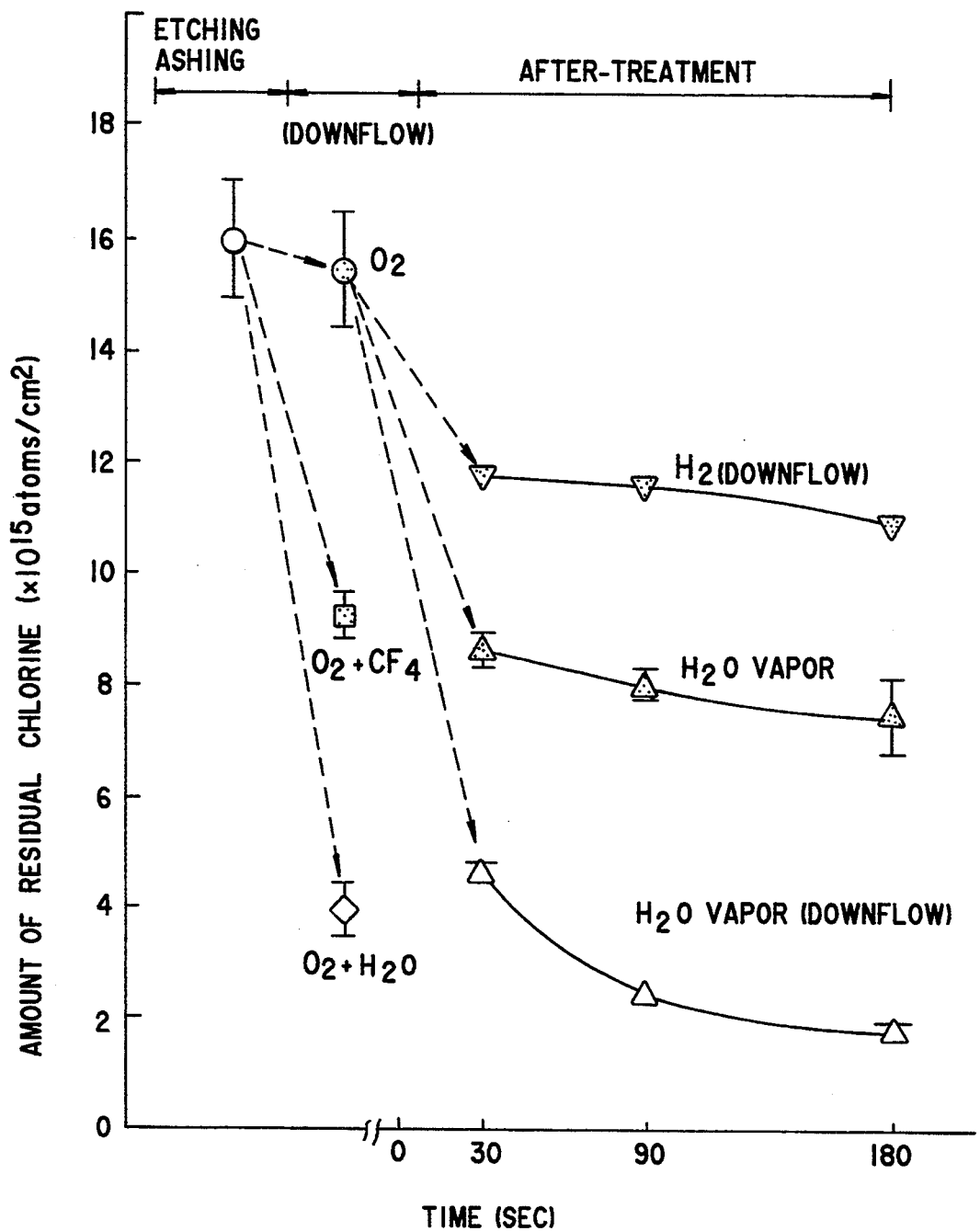
FIG. 9 is a graph showing an effect of reducing the amount of residual chlorine according to the present invention.

FIG. 9 is a graph schematically showing the relationships between the amount of residual chlorine and the conditions for treatment shown in Table 1. Graphic symbols indicating each sample in FIG. 9 are given in Table 1 in order for facilitating cross-reference.

As can be seen from Table 1 and FIG. 9, the amount of residual chlorine is considerably low in the third embodiment (④ in Table 1 and in FIG. 9) and in the fourth embodiment (⑧ and 10 in Table 1 and Δ in FIG. 9) of the present invention, in the former, an ashing operation being performed by using a plasma generated in a gaseous mixture in which water vapor ($H_2O$) was added into oxygen ($O_2$) and, in the latter, after-treatment being performed by using a plasma of water vapor ($H_2O$) after an ashing operation. Also, after-corrosion does not practically occur in the embodiments. In contrast, an effect for reducing the amount of residual chlorine is small in an ashing operation using the other gases or after-treatment posterior to the ashing operation, and thus after-corrosion cannot be completely prevented.

In the third embodiment, the automatic processing system of FIG. 5(a) for performing an ashing operation and removing residual chlorine concurrently was used. In the fourth embodiment, the automatic processing system which is capable of performing after-treatment for removing residual chlorine separately from the ashing operation was used. Advantages and disadvantages of these automatic processing system will now be compared.

The automatic processing system of FIG. 5(a) can perform an ashing operation and remove residual chlorine simultaneously, so it is efficient. When an ashing operation and the removal of residual chlorine are performed separately, these processes can be performed by using the same apparatus. Therefore, the present invention has an advantage in that the processing system is simple in construction. However, as will be described later, when water vapor must be removed from the ashing apparatus, it takes a long period of time for baking of the chamber 21 and vacuum exhaust.

In contrast, the automatic processing system of FIG. 4 can avoid the influences of water vapor on an ashing operation. Particularly, in an ashing operation using gas in which carbon tetrafluoride ($CF_4$) is added into oxygen ($O_2$), if there is water vapor ($H_2O$) in this gas atmosphere, $CF_4$ is consumed by the reaction of $CF_4 + 2H_2O \rightarrow 4HF + CO_2$, with the result that the ashing speed becomes lower. In such a case, therefore, the automatic processing system of FIG. 4 is effective.

Figure 7:
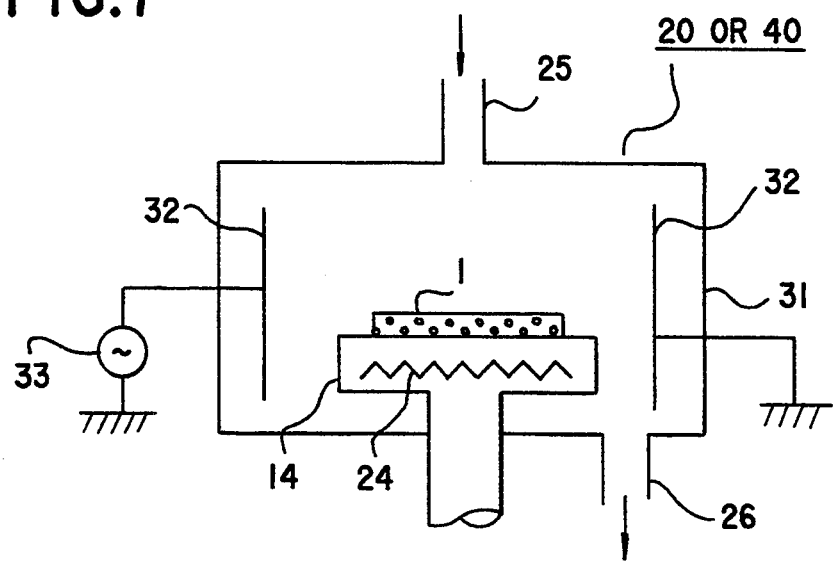
FIG. 7 is a schematic view showing a detailed construction of an example of the substitute ashing apparatus 20 or the after-treatment apparatus 40 in FIG. 4 or FIG. 5(a)
Figure 8:
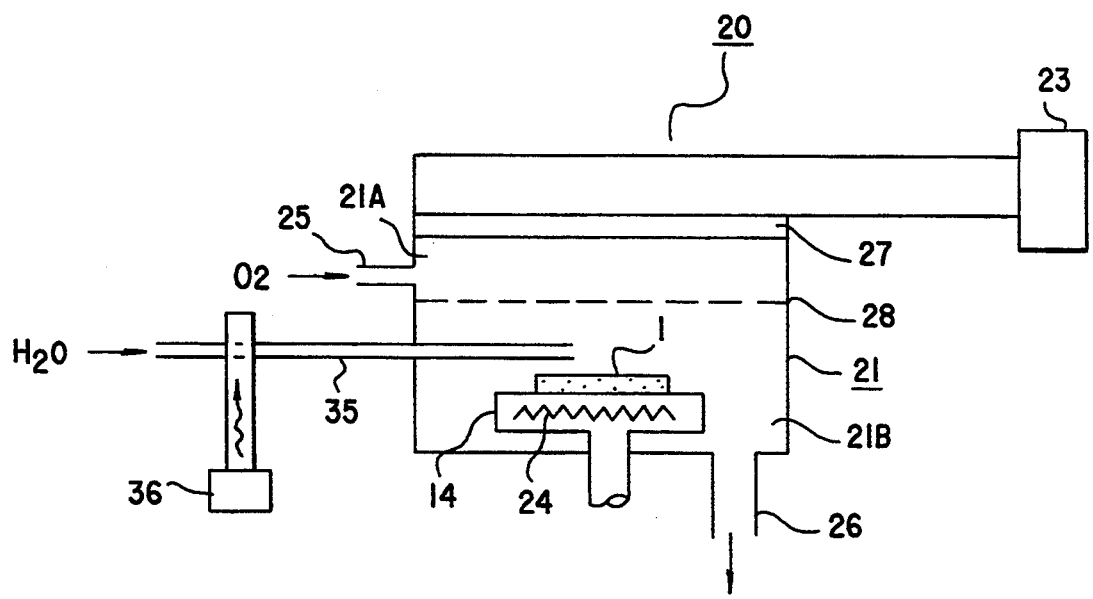
FIG. 8 is a schematic view showing a detailed construction of an example of the substitute ashing apparatus 20 in FIG. 4 or FIG. 5(a)

The ashing apparatus 20 in FIG. 5(a) and FIG. 4 and the after-treatment apparatus 40 in FIG. 4 can be substituted by one constructed as shown in FIG. 7 or 8.

Shown in FIG. 7 is a so-called plasma ashing type apparatus by which the substrate 1 to be processed is directly exposed to a plasma generated between electrodes 32. In FIG. 7, reference numeral 31 denotes a chamber, and reference numeral 33 denotes a high-frequency power supply.

FIG. 8 shows an apparatus which is basically the same as the so-called downflow type shown in FIG. 5(b). It is characterized in that oxygen ($O_2$) and water vapor ($H_2O$) can be introduced separately to the ashing apparatus 20, as in the third embodiment. That is, only oxygen ($O_2$) is introduced into the plasma generation chamber 21A, and water vapor ($H_2O$) is introduced into the ashing chamber 21B. Another microwave generation source 36 is disposed in the midsection of the gas introduction pipe 35 for that purpose.

Neutral active species generated in the plasma generation chamber 21A flow into the ashing chamber 21B after passing through the small openings of the shower head 28. Meanwhile, plasma of water vapor ($H_2O$) is generated by the microwave generation source 36. Ions therein recombines with electrons while passing through the gas introduction pipe 35. Therefore, excited $H_2O$ molecules, neutral atomic hydrogen (H) and oxygen (O), or OH free radicals are introduced into the ashing chamber 21B.

Many different embodiments of the present invention may be constructed without departing from the spirit and scope of the present invention. It should be understood that the present invention is not limited to the specific embodiments described in this specification, and is only limited in the appended claims.

TABLE 1

| Conditions | Amount of residual chlorine μm g/cm² | 10¹⁵ atoms/cm² | After-corrosion | Symbols shown in FIG. 9 |
|---|---|---|---|---|
| ① Etching only | 0.92 ± 0.06 | 16.0 ± 1.0 | Large | ○ |
| ② Downflow ashing using $O_2$ after ① | 0.89 ± 0.06 | 15.5 ± 1.0 | Large | |
| ③ Downflow ashing using $O_2 + CF_4$ after ① | 0.54 ± 0.03 | 9.3 ± 0.4 | Small | |
| ④ Downflow ashing using $O_2 + H_2O$ after ① | 0.23 ± 0.03 | 4.0 ± 0.5 | No | |
| ⑤ Exposure to $H_2O$ after ② (30 sec) | 0.51 ± 0.02 | 8.7 ± 0.3 | Small | |
| ⑥ Exposure to $H_2O$ after ② (90 sec) | 0.48 ± 0.01 | 8.1 ± 0.2 | Small | |
| ⑦ Exposure to $H_2O$ after ② (180 sec) | 0.45 ± 0.04 | 7.6 ± 0.7 | Small | |

TABLE 1-continued

| Conditions | Amount of residual chlorine μm g/cm² | 10¹⁵ atoms/cm² | After-corrosion | Symbols shown in FIG. 9 |
|---|---|---|---|---|
| ⑧ Downflow treatment using H₂O after ② (30 sec) | 0.28 ± 0.01 | 4.7 ± 0.2 | None | ▲ |
| ⑨ Downflow treatment using H₂O after ② (90 sec) | 0.15 ± 0.00 | 2.5 ± 0.0 | No | ▲ |
| 10 Downflow treatment using H₂O after ② (180 sec) | 0.11 ± 0.01 | 1.9 ± 0.1 | No | ▲ |
| 11 Downflow treatment using H₂ after ② (30 sec) | 0.68 ± 0.01 | 11.8 ± 0.2 | Small | |
| 12 Downflow treatment using H₂O after ② (90 sec) | 0.68 ± 0.01 | 11.7 ± 0.1 | Small | |
| 13 Downflow treatment using H₂ after ② (180 sec) | 0.64 ± 0.01 | 11.1 ± 0.2 | Small | |

Exposure to H₂O: heated at 120° C. in water vapor at 0.1 Torr.

What is claimed is:

1. A method for producing semiconductor integrated circuits, comprising the steps of:
   a first step of selectively etching a metallic film formed on a surface of a substrate and exposed through a mask made of a resist which selectively covers said metallic film, by effectively contacting said metallic film exposed through said mask with a gaseous etchant comprising chlorine, bromine, or a compound thereof; and
   a second step of removing the mask used in said etching by effectively ashing said mask, by contacting said mask with a plasma generated in an atmosphere comprising oxygen gas and water vapor under conditions sufficient to also remove etchant components remaining strongly attached to and in effective contact with said metallic film or said substrate down to a residual concentration which is sufficiently low as to prevent the substantial after corrosion of said metallic film, and
   wherein removing of the residual gaseous etchant components includes using the plasma to force said gaseous etchant components to be released from said metallic film and said substrate.

2. The method according to claim 1, wherein the metallic film is composed of aluminum or an alloy thereof.

3. The method according to claim 2, further comprising the step of: providing a barrier layer between the metallic film and the substrate so as to prevent a reaction between the metallic film and the substrate.

4. The method according to claim 1, wherein the substrate is maintained at a temperature of between 100° and 250° C. during said second step.

5. The method according to claim 1, wherein during said second step, said removing of the mask and said removing of chlorine, bromine, or a compound thereof which are components of the gaseous etchant each include using neutral active species extracted from the plasma.

6. The method according to claim 1, wherein during said second step, the mask and the metallic film exposed as the result of said removing of the mask are exposed to the plasma.

7. A method for producing semiconductor integrated circuits, comprising the steps of:
   a first step of selectively etching a metallic film formed on a surface of a substrate and exposed through a mask by using a gaseous etchant comprising chlorine, bromine, or a compound thereof after the metallic film is selectively covered with the mask made of a resist; and
   a second step of removing the mask used in said etching by ashing, said second step including separately generating a plasma in a first atmosphere containing oxygen gas and in a second atmosphere containing water vapor, exposing the mask to neutral active species extracted from the plasma generated in the first atmosphere, and removing chlorine, bromine, or a compound thereof which are components of a residual etchant exposed on a surface of the metallic film by exposing the residual etchant components to at least neutral active species in the plasma generated in the second atmosphere thereby forcing the residual etchant components to be released from the substrate.

8. The method according to claim 7, wherein the metallic film is composed of aluminum or an alloy thereof.

9. The method according to claim 8, wherein a barrier layer for blocking the reaction between the metallic film and the substrate is provided between the metallic film and the substrate.

10. The method according to claim 7, wherein the substrate is maintained at a temperature of between 100° and 250° C. during said second step.

11. A method for producing semiconductor integrated circuits, comprising the steps of:
   a first step of selectively etching a metallic film exposed through a mask by contacting said metallic film exposed through said mask with a gaseous etchant comprising chlorine, bromine, or a compound thereof after the metallic film formed on a surface of a substrate is selectively covered with the mask made of a resist;
   a second step of removing the mask used in said etching by ashing by effectively contacting said mask with a first plasma generated in a first atmosphere comprising oxygen gas; and
   a third step of removing chlorine, bromine, or a compound thereof, which are components of residual etchant on a surface of the metallic film which have become exposed as the result of said removing of the mask, said step of removing the residual etchant components including contacting said metallic film with a second plasma generated in a second atmosphere comprising water vapor thereby forcing the residual etchant components to be released from the surface of said metal.

12. The method according to claim 11, wherein said second and third steps are performed by using the same apparatus.

13. The method according to claim 11, wherein said second and third steps are performed by using a different apparatus for each step.

14. The method according to claim 13, wherein the apparatus used in said third step is of a downflow type.

15. The method according to claim 11, wherein the metallic film is composed of aluminum or an alloy thereof.

16. The method according to claim 11, further comprising the step of: providing a barrier layer between the metallic film and the substrate so as to prevent a reaction between the metallic film and the substrate.

17. The method according to claim 11, wherein the substrate is maintained at a temperature of between 100° and 250° C. in said second step.

18. The method according to claim 11, wherein the metallic film is exposed to neutral active species extracted from the second plasma in said third step.

19. The method according to claim 11, wherein the metallic film is exposed to the second plasma in said third step.

* * * * *

UNITED STATES PATENT AND TRADEMARK OFFICE
CERTIFICATE OF CORRECTION

PATENT NO. : 5,397,432

DATED : March 14, 1995

INVENTOR(S) : Konno, et al.

It is certified that error appears in the above-identified patent and that said Letters Patent is hereby corrected as shown below:

Column 10-11, Table 1 should be deleted and substitute therefor the attached Table 1.

Signed and Sealed this

Nineteenth Day of January, 1999

Attest:

Attesting Officer

Acting Commissioner of Patents and Trademarks

Table 1

| | Conditions | Amount of residual chlorine $\mu$m g/cm$^2$ | $10^{15}$ atoms/cm$^2$ | After-corrosion | Symbols shown in Fig. 9 |
|---|---|---|---|---|---|
| ① | Etching only | 0.92±0.06 | 16.0±1.0 | Large | ○ |
| ② | Downflow ashing using O$_2$ after ① | 0.89±0.06 | 15.5±1.0 | Large | ● |
| ③ | Downflow ashing using O$_2$+CF$_4$ after ① | 0.54±0.03 | 9.3±0.4 | Small | ■ |
| ④ | Downflow ashing using O$_2$+H$_2$O after ① | 0.23±0.03 | 4.0±0.5 | No | ◇ |
| ⑤ | Exposure to H$_2$O after ② (30sec) | 0.51±0.02 | 8.7±0.3 | Small | ▲ |
| ⑥ | Exposure to H$_2$O after ② (90sec) | 0.48±0.01 | 8.1±0.2 | Small | ▲ |
| ⑦ | Exposure to H$_2$O after ② (180sec) | 0.45±0.04 | 7.6±0.7 | Small | ▲ |
| ⑧ | Downflow treatment using H$_2$O after ② (30sec) | 0.28±0.01 | 4.7±0.2 | None | △ |
| ⑨ | Downflow treatment using H$_2$O after ② (90sec) | 0.15±0.00 | 2.5±0.0 | No | △ |
| ⑩ | Downflow treatment using H$_2$O after ② (180sec) | 0.11±0.01 | 1.9±0.1 | No | △ |
| ⑪ | Downflow treatment using H$_2$ after ② (30sec) | 0.68±0.01 | 11.8±0.2 | Small | ▼ |
| ⑫ | Downflow treatment using H$_2$O after ② (90sec) | 0.68±0.01 | 11.7±0.1 | Small | ▼ |
| ⑬ | Downflow treatment using H$_2$ after ② (180sec) | 0.64±0.01 | 11.1±0.2 | Small | ▼ |

(12) EX PARTE REEXAMINATION CERTIFICATE (7561st)
United States Patent
Konno et al.

(10) Number: US 5,397,432 C1
(45) Certificate Issued: Jun. 22, 2010

(54) METHOD FOR PRODUCING SEMICONDUCTOR INTEGRATED CIRCUITS AND APPARATUS USED IN SUCH METHOD

(75) Inventors: Jun-ichi Konno, Kuwana (JP); Keisuke Shinagawa, Kawasaki (JP); Toshiyuki Ishida, Kawasaki (JP); Takahiro Ito, Kawasaki (JP); Tetsuo Kondo, Kawasaki (JP); Fukashi Harada, Kuwana (JP); Shuzo Fujimura, Tokyo (JP)

(73) Assignee: Fujitsu Limited, Kamikodanaka, Nakahara-Ku, Kawasaki-shi, Kanagawa (JP)

Reexamination Request:
No. 90/008,878, Oct. 18, 2007

Reexamination Certificate for:
Patent No.: 5,397,432
Issued: Mar. 14, 1995
Appl. No.: 07/743,383
Filed: Aug. 21, 1991

Certificate of Correction issued Jan. 19, 1999.

(22) PCT Filed: Jun. 26, 1991
(86) PCT No.: PCT/JP91/00861
§ 371 (c)(1),
(2), (4) Date: Aug. 21, 1991
(87) PCT Pub. No.: WO92/00601
PCT Pub. Date: Jan. 9, 1992

(30) Foreign Application Priority Data
Jun. 27, 1990 (JP) .............................. 2171791

(51) Int. Cl.
*H01L 21/02* (2006.01)
*H01L 21/311* (2006.01)
*H01L 21/00* (2006.01)
*H01L 21/3213* (2006.01)

(52) U.S. Cl. .............................. 438/714; 257/E21.256; 257/E21.311; 134/1; 438/712; 438/720
(58) Field of Classification Search ........................ None
See application file for complete search history.

(56) References Cited

U.S. PATENT DOCUMENTS 4,983,254 A 1/1991 Fujimura et al.
5,007,981 A 4/1991 Kawasaki et al.

FOREIGN PATENT DOCUMENTS

EP 247603 A1 * 12/1987
EP 387097 A1 * 9/1990
EP 0 247 603 B1 8/1999

* cited by examiner

*Primary Examiner*—Alan Diamond

(57) ABSTRACT

To prevent after-corrosion of wiring or electrodes formed by patterning films of aluminum or an alloy thereof by reactive ion etching (RIE) using an etchant containing chlorine gas or its gaseous compounds, residual chlorine on the surface of the wiring or electrodes is removed by exposing it to a plasma generated in an atmosphere containing water vapor or to neutral active species extracted from the plasma. This treatment is performed either at the same time or after an ashing operation, an operation for removing a resist mask used in the aforesaid RIE by adding water vapor to an atmosphere containing oxygen. To perform the latter separate treatment, an automatic processing system is disclosed in which an after-treatment apparatus for removing residual chlorine is connected, via a second load lock chamber, to an ashing apparatus connected to a RIE apparatus by a load lock chamber which is capable of making a vacuum.

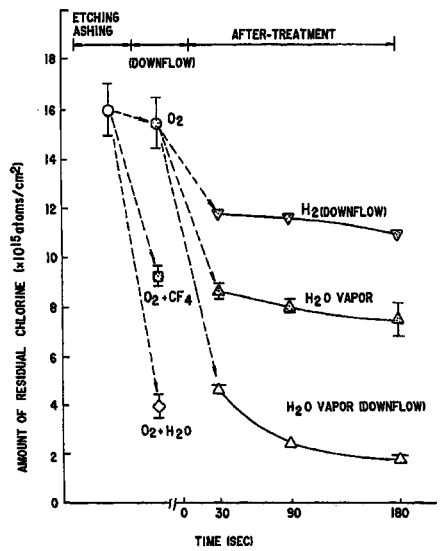

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-12 and 15-19 are cancelled.

Claim 13 is determined to be patentable as amended.

Claim 14, dependent on an amended claim, is determined to be patentable.

13. [The method according to claim 11,] *A method for producing semiconductor integrated circuits, comprising the steps of:*

*a first step of selectively etching a metallic film exposed through a mask by contacting said metallic film exposed through said mask with a gaseous etchant comprising chlorine, bromine, or a compound thereof after the metallic film formed on a surface of a substrate is selectively covered with the mask made of a resist;*

*a second step of removing the mask used in said etching by ashing by effectively contacting said mask with a first plasma generated in a first atmosphere comprising oxygen gas or neutral active species extracted from the first plasma generated in the atmosphere comprising oxygen gas; and*

*a third step of removing chlorine, bromine, or a compound thereof, which are components of residual etchant on a surface of the metallic film which have become exposed as the result of said removing of the mask, said step of removing the residual etchant components including contacting said metallic film with a second plasma generated in a second atmosphere comprising water vapor, or neutral active species extracted from the second plasma generated in a second atmosphere comprising water vapor, thereby forcing the residual etchant components to be released from the surface of said metallic film;* wherein said second and third steps are performed by using a different apparatus for each step.

* * * * *